United States Patent [19]
Thackeray et al.

[11] Patent Number: 5,368,993
[45] Date of Patent: Nov. 29, 1994

[54] METHOD OF FORMING RELIEF IMAGE HAVING LINE WIDTH LESS THAN 0.35 MICRONS UTILIZING COPOLYMER BINDER HAVING PHENOLIC AND NONAROMATIC CYCLIC ALCOHOL UNITS

[75] Inventors: James W. Thackeray, Braintree; Mark Denison, Cambridge; George W. Orsula, Tewksbury, all of Mass.

[73] Assignee: Shipley Company Inc., Marlborough, Mass.

[21] Appl. No.: 228,159

[22] Filed: Apr. 15, 1994

Related U.S. Application Data

[62] Division of Ser. No. 10,815, Jan. 29, 1993.

[51] Int. Cl.$^5$ ............................................. G03F 7/30
[52] U.S. Cl. .................................... 430/325; 430/326; 430/909
[58] Field of Search ............... 430/192, 270, 325, 326, 430/905, 909

[56] References Cited

U.S. PATENT DOCUMENTS 5,128,232  7/1992  Thackeray et al. ................ 430/192

FOREIGN PATENT DOCUMENTS 0419147  3/1991  European Pat. Off. .

*Primary Examiner*—Janet C. Baxter
*Assistant Examiner*—Christopher G. Young
*Attorney, Agent, or Firm*—Robert L. Goldberg

[57] ABSTRACT

The present invention relates to photoresists particularly suitable for deep U.V. exposure and having the capability of forming highly resolved features. The invention is characterized by use of a resist resin binder that comprises a nonaromatic cyclic alcohol-phenol copolymer that has a relatively low molecular weight and narrow distribution of molecular weight and cyclic alcohol concentration.

5 Claims, No Drawings

METHOD OF FORMING RELIEF IMAGE HAVING LINE WIDTH LESS THAN 0.35 MICRONS UTILIZING COPOLYMER BINDER HAVING PHENOLIC AND NONAROMATIC CYCLIC ALCOHOL UNITS

This is a divisional of copending application Ser. No. 08/010,815 filed Jan. 29, 1993.

BACKGROUND OF THE INVENTION

1. Field of the Invention

This invention relates to photoresists particularly suitable for deep U.V. exposure and having the capability of forming highly resolved features of submicron dimensions.

2. Background Art

Photoresists are photosensitive films used for transfer of images to a substrate. They form negative or positive images. After a coating of a photoresist is formed on a substrate, the coating is selectively exposed through a photomask to a source of activating energy such as ultraviolet light. The photomask has areas that are opaque to activating radiation and other areas that are transparent to activating radiation. The pattern in the photomask of opaque and transparent areas defines a desired image to be transferred to a substrate. A relief image is provided upon development of the latent image patterned in the resist coating. The use of photoresists are generally described, for example, in Deforest, *Photoresist Materials and Processes*, McGraw Hill Book Company, New York (1975), and in Moreau, *Semiconductor Lithography, Principles, Practices and Materials*, Plenum Press, New York (1988).

Known photoresists can form features having resolution and size sufficient for many commercial applications. However for many other applications the need exists for new photoresists that can provide highly resolved images of submicron dimensions.

In U.S. Pat. No. 5,128,232 to Thackeray et al. highly useful photoresist compositions are disclosed. The patent discloses, inter alia, use of a resist resin binder that comprises a copolymer of nonaromatic cyclic alcohol and phenol units. The disclosed photoresists are particularly suitable for exposure by deep U.V. radiation. As is recognized by those in the art "deep U.V. radiation" refers to exposure radiation having a wavelength in the range of about 350 nm or less, more typically in the range of about 300 nm or less.

SUMMARY OF THE INVENTION

The present invention provides a photoresist composition that comprises a radiation sensitive component in admixture with a resin binder, the resin binder containing a copolymer of nonaromatic cyclic alcohol and phenol units, and wherein said copolymer has one or more of the following critical structural characteristics:

1) a molecular weight (weight average) of less than about 5,000 daltons, more preferably a molecular weight of greater than or equal to about 1,000 daltons and less than about 5,000 daltons, still more preferably a molecular weight of between about 1,500 and 4,500 daltons, and even more preferably a weight average molecular weight of between about 1,500 and 4,000 daltons;

2) a narrow range of molecular weight distribution, preferably a ratio of weight average molecular weight to number average molecular weight of about 3 units or less, more preferably a ratio of about 2 or less, still more preferably a ratio of about 1.5 or less; and 3) a narrow range of distribution of the concentration of the nonaromatic cyclic alcohol units of the copolymer, preferably the cyclic alcohol concentration distribution being within about 8 mole percent of a desired cyclic alcohol concentration (based on the total concentration of hydroxy-substituted units on the copolymer), more preferably the concentration distribution being within about 5 mole percent of a desired concentration, and still more preferably the cyclic alcohol concentration distribution being within about 2 mole percent of a desired concentration.

It has been surprisingly found that a photoresist comprising as a resin binder component this copolymer with one or preferably a plurality of the above structural features can provide highly resolved patterned images (e.g., a line having essentially vertical sidewalls and a slightly rounded top) of sub-half micron dimensions including highly resolved lines having a width of less than about 0.35 microns. The invention thus provides methods for forming relief images, including methods for forming a highly resolved relief image such as a pattern of lines wherein each line has essentially vertical sidewalls and a line width of less than about 0.35 microns. The invention further provides articles of manufacture comprising substrates such as a microelectronic wafer or a liquid crystal display substrate having coated thereon the photoresists and relief images of the invention. Other aspects of the invention are disclosed infra.

DETAILED DESCRIPTION OF THE INVENTION

The invention comprises photoresists that use copolymers of a nonaromatic cyclic alcohol and a phenol as a resin binder. These copolymers are in some respects analogous to those disclosed in U.S. Pat. No. 5,128,232 to Thackeray et al. but have one or more of the structural features disclosed above. Preferred copolymers for purposes of this invention are those formed by the hydrogenation of a phenol formaldehyde (novolak) or a polyvinyl phenol resin.

Procedures for the preparation of conventional novolak and polyvinyl phenol resins used as photoresists binders are well known in the art and disclosed in numerous publications including those discussed above. Novolak resins are the thermoplastic condensation products of a phenol and an aldehyde. Examples of suitable phenols for condensation with an aldehyde, especially formaldehyde, for the formation of novolak resins include phenol; m-cresol; o-cresol; p-cresol; 2,4-xylenol; 2,5-xylenol; 3,4-xylenol; 3,5-xylenol and thymol. An acid catalyzed condensation reaction results in the formation of a suitable novolak resin. The preferred novolak resins conventionally used for the formation of photoresists are the cresol formaldehyde condensation products.

Polyvinyl phenol resins are thermoplastic polymers that may be formed by block polymerization, emulsion polymerization or solution polymerization of the corresponding monomers in the presence of a catalyst. Vinylphenols useful for the production of polyvinyl phenol resins may be prepared, for example, by hydrolysis of commercially available coumarin or substituted coumarins, followed by decarboxylation of the resulting hydroxy cinnamic acids. Useful vinylphenols may also be prepared by dehydration of the corresponding hydroxy alkyl phenols or by decarboxylation of hydroxy cinnamic acids resulting from the reaction of substituted or nonsubstituted hydroxybenzaldehydes with malonic acid.

Preferred resins for purposes of this invention are copolymers of phenols and nonaromatic cyclic alcohols analogous in structure to the novolak resins and polyvinyl phenol resins. These copolymers may be formed in several ways. For example, in the conventional preparation of a polyvinyl phenol resin, a cyclic alcohol may be added to the reaction mixture a comonomer during the polymerization reaction which is thereafter carried out in normal manner. The nonaromatic cyclic alcohol is preferably aliphatic, but may contain one or two double bonds. The cyclic alcohol is preferably one closest in structure to the phenol. For example, if the resin is a polyvinyl phenol, the comonomer would be vinyl cyclohexanol.

The preferred method for formation of the copolymer comprises hydrogenation of a preformed novolak resin or a preformed polyvinyl phenol resin. Hydrogenation may be carried out using art recognized hydrogenation procedures, for example, by passing a solution of the phenolic resin over a reducing catalyst such as a platinum or palladium coated carbon substrate or preferably over Raney nickel at elevated temperature and pressure. The specific conditions are dependent upon the polymer to be hydrogenated. More particularly, the polymer is dissolved in a suitable solvent such as ethyl alcohol or acetic acid, and then the solution is contacted with a finely divided Raney nickel catalysts and allowed to react at a temperature of from about 100° to 300° C. at a pressure of from about 50 to 300 atmospheres or more. The finely divided nickel catalyst may be a nickel-on-silica, nickel-on-alumina, or nickel-on-carbon catalyst depending upon the resin to be hydrogenated. Hydrogenation is believed to reduce the double bonds in some of the phenolic units resulting in a random copolymer of phenolic and cyclic alcohol units interspersed in the polymer in percentages dependent upon the reaction conditions used.

Preferred cyclic alcohol-phenol copolymers include those having a structure selected from the group of:

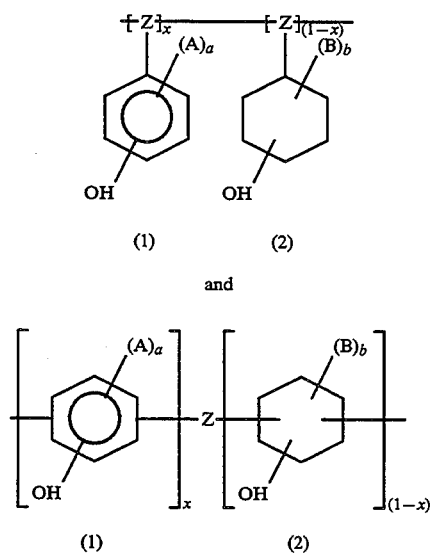

where unit (1) represents a phenolic unit and unit (2) represents a cyclic alcohol unit; (Z) is an alkylene bridge having from 1 to 3 carbon atoms: A is a substituent on the aromatic ring replacing hydrogen such as lower alkyl having from 1 to 3 carbon atoms, halo such as chloro or bromo, alkoxy having from 1 to 3 carbon atoms, hydroxyl, nitro, amino, etc.; a is a number varying from 0 to 3; B is a substituent such as hydrogen, lower alkyl having from 1 to 3 carbon atoms, halo such as chloro or bromo, alkoxy having from 1 to 3 carbon atoms, hydroxyl, nitro, amino, etc. provided that at least 3 of said B substituents are hydrogen; b is an integer varying between 6 and 10; and X is the mole fraction of the units (1) in the copolymer which varies between 0.50 and 0.99 at least for use of the copolymer as a resin binder for negative-acting resists and conventional positive-acting resists. From the formula, it can be seen that the percentage of cyclic alcohol units does not exceed 50 mole percent of the total polymer, which is preferred at least for use of the copolymer as a resin binder component for a negative or conventional positive resist. More preferably, the cyclic alcohol units varies from about 1 to 30 mole percent and most preferably, from about 5 to 15 mole percent of the polymer at least for use of the copolymer as a resin binder for negative or conventional positive resists. In no event should the percentage of cyclic alcohol units be so high as to prevent development of the photoresist following exposure of the same to activating radiation.

It has now been found that performance capabilities of a photoresist can be enhanced by limiting the molecular weight of the nonaromatic cyclic alcohol phenol copolymer to relatively low values. Preferably the molecular weight (weight average) of the nonaromatic cyclic alcohol-phenol copolymer is less than about 5,000 daltons, more preferably the copolymer molecular weight (weight average) is greater than or equal to about 1,000 daltons and less than about 5,000 daltons, still more preferably weight average molecular weight is between about 1,500 and 4,500 daltons, and even more preferably the copolymer weight average molecular weight is between about 1,500 and 4,000 daltons.

Further preferred is use of the non-aromatic cyclic alcohol-phenol copolymer as a photoresist resin binder where the copolymer has a narrow molecular weight distribution. Preferably the ratio of the weight average molecular weight to number average molecular weight of the copolymer is in the range of about 3 units or lower; more preferably said ratio is about 2 units or less; still more preferably the ratio of weight average molecular to number average molecular weight of the copolymer is about 1.5 units or less.

The molecular weight distribution of the copolymer can be limited to within these narrow ranges by, e.g., using an anionic polymerization to form the copolymer and/or fractionalization of the formed polymer to remove material having a molecular weight outside the desired distribution range.

Molecular weights (either Mw or Mn) of the nonaromatic alcohol-phenol copolymer are suitably determined by Gel Permeation Chromatography.

It has been additionally found that performance capabilities of a photoresist can be enhanced by use of a nonaromatic cyclic alcohol-phenol copolymer as a resin binder component where the distribution of the amount of cyclic alcohol units in the copolymer is within a narrow range. Preferably the distribution of the cyclic alcohol units concentration is within about 8 mole percent of a desired average nonaromatic cyclic alcohol concentration of the copolymer, more preferably the distribution of the nonaromatic cyclic alcohol units concentration is within about 5 mole percent of a desired average concentration, still more preferably the distribution of the nonaromatic cyclic alcohol units is within about 2 mole percent of a desired cyclic alcohol concentration value. As used herein, the cyclic alcohol concentration distribution ranges and average cyclic concentration values of a copolymer are expressed as the mole percent of the total hydroxyl-substituted units of the copolymer, which typically is the mole percent of the total nonaromatic cyclic alcohol and phenol units of the copolymer. In most cases the copolymer consists, consists essentially of, or consists at least substantially of phenol and nonaromatic cyclic alcohol units; and thus the concentration distribution ranges and average concentration values are expressed at least substantially as a percentage of total units of the copolymer, and more typically the concentration distribution ranges and average concentration values are expressed at least essentially as a percentage of total units of the copolymer.

To illustrate the above concentration distribution ranges, if the average nonaromatic cyclic alcohol concentration of the copolymer is 10 percent, preferably the distribution of the cyclic alcohol concentration is between about 2 and 18 mole percent, more preferably the distribution of the cyclic alcohol concentration is between 5 and 15 mole percent, and still more preferably the distribution of the cyclic alcohol concentration is between about 8 and 12 mole percent.

The distribution of the cyclic alcohol concentration of the copolymer can be kept to within those preferred ranges by control of reaction conditions during the copolymer synthesis. For example, if the copolymer is prepared by partial hydrogenation of a preformed phenolic resin, hydrogenation conditions should be employed that promote a thermodynamic distribution rather than a kinetic distribution. In particular reaction temperature can be increased to promote regular displacement of a polymer chain from the metal hydrogenation catalyst and thereby avoid excessive hydrogenation of one polymer chain which, in turn, will result in too little hydrogenation of another polymer chain assuming a controlled amount of hydrogen is employed. Control of the reaction pressure also could promote formation of the copolymer with a narrow cyclic alcohol concentration distribution. Optimal hydrogenation reaction conditions to provide a narrow cyclic alcohol concentration distribution for a particular polymer can be readily determined empirically by the skilled artisan. If the cyclic alcohol component is formed by polymerization of phenolic and nonaromatic cyclic alcohol monomers, the polymerization reaction can be readily tailored to limit the cyclic alcohol concentration distribution of the resultant polymer.

The distribution of cyclic alcohol concentration of the copolymer component of a resin binder can be readily determined by methods known to those skilled in the art including e.g. standard chromatographic techniques such as dissolving the copolymer component in a suitable solvent, e.g. propylene glycol monomethyl ether acetate or mixtures thereof with other solvents such as anisole, and eluting the copolymer solution through a column of silica gel and analyzing the resultant fractions by proton NMR to determine the cyclic alcohol concentration of each fraction. Extraction techniques also can be employed. Fractions containing copolymers that have a high nonaromatic cyclic alcohol concentration (e.g., about 20 mole percent or greater) often visually appear hazy in solution due to the comparatively limited solubility of such copolymers in many solvents.

One preferred class of photoresists of this invention are those positive-acting photoresists that use the above described copolymer of the phenol and cyclic alcohol as a binder and an o-quinone diazide sulfonic acid ester as a photosensitizer. The sensitizers most often used in such photoresists are naphthoquinone diazide sulfonic acids such as those disclosed by Kosar, Light Sensitive Systems, John Wiley & Sons, 1965, pp. 343 to 352. These sensitizers form an acid in response to radiation of difference wavelengths ranging from visible to X-ray. Thus, the sensitizer chosen will depend, in part, upon the wavelength used for exposure. By selecting the appropriate sensitizer, the photoresists can be imaged by deep U.V., E-beam, laser or any other activating radiation conventionally used for imaging photoresists. Preferred sensitizers include the 2,1,4-diazonaphthoquinone sulfonic acid esters.

Another preferred class of photoresists for use in accordance with the present invention are those compositions that comprise the above described nonaromatic cyclic alcohol-phenol copolymer as a resin binder, a photoacid generator and one or more other materials that will result in curing, crosslinking or hardening of the composition upon exposure to activating radiation and, typically, heating. A preferred composition is an acid-hardening photoresist that comprises a photoacid generator, a resin binder that comprises the described nonaromatic cyclic alcohol-phenol copolymer, and an amine-based crosslinker such as the melamine-formaldehyde Cymel resins available from American Cyanamid. These acid-hardening resists are described, e.g., in European Patent Applications 0,164,248 and 0,232,972 and U.S. Pat. No. 5,128,232.

A chemically-amplified positive-acting composition is another preferred photoresist of the present invention. For such a resist the above described nonaromatic cyclic alcohol and phenol copolymer is employed as a resin binder with the modification that the copolymer comprises pendant acid labile groups bonded to at least a portion of the copolymer's hydroxyl substituents. The resist contains a photoacid generator compound which generates an acidic photoproduct upon exposure to activating radiation. This photoproduct renders the exposed regions of the resist more developer soluble by catalyzing a deprotection reaction of the acid labile groups of the copolymer to liberate polar functional groups such as carboxy. See Lamola, et al., "Chemically Amplified Resists, *Solid State Technology*, 53–60 (August 1991). Modification of the nonaromatic cyclic alcohol-phenol copolymer by suitable incorporation of pendant acid labile groups and use of resists incorporating such a modified copolymer resin binder are disclosed in copending U.S. patent application Ser. No. 07/763827 of Sinta et at., filed on Sep. 23, 1991 (corresponds to European Patent Application No. 92115982.8).

The photoresists of the invention are generally prepared following known procedures (see, in particular, U.S. Pat. No. 5,128,232 and the above-cited copending application) with the exception that the copolymer binder described above is substituted for prior resins used in the formulation of such photoresists. For example, a resist of the invention can be prepared as a coating composition by dissolving the components of the photoresist in a suitable solvent such as, e.g., a glycol ether such as 2-methoxyethyl ether (diglyme), ethylene glycol monomethyl ether, propylene glycol monomethyl ether; a Cellosolve ester such as methyl Cellosolve Acetate; an aromatic hydrocarbon such toluene or xylene; or a ketone such as methylethyl ketone. Typically the solids content of the photoresist varies between 5 and 35 percent by weight of the total weight of the photoresist composition.

The photoresists of the invention can be used in accordance with known procedures. Though the photoresists of the invention may be applied as a dry film, they are preferably applied on a substrate as a liquid coating composition, dried by heating to remove solvent preferably until the coating layer is tack free, exposed through a photomask to activating radiation, optionally post-exposure baked to create or enhance solubility differences between exposed and nonexposed regions of the resist coating layer, and then developed preferably with an aqueous alkaline developer to form a relief image. The substrate suitably can be any substrate used in processes involving photoresists such as a microelectronic wafer. For example, the substrate can be a silicon, silicon dioxide or aluminum-aluminum oxide microelectronic wafer. Gallium arsenide, ceramic, quartz or copper substrates may also be employed. Substrates used for liquid crystal display and other flat panel display applications are also suitably employed, e.g., glass substrates, indium tin coated substrates and the like. A liquid coating resist composition may be applied by any standard means such as spinning, dipping or roller coating. The exposure energy should be sufficient to effectively activate the photoactive component of the radiation sensitive system to produce a patterned image in the resist coating layer. Suitable exposure energies typically range from about 10 to 300 mJ/cm$^2$. An exposure wavelength in the deep U.V. range is preferably used for the photoresists of the invention, particularly an exposure wavelength of about 248 nm. Suitable post-exposure bake temperatures are from about 50° C. or greater, more specifically a temperature in the range of from 50° to 140° C. For an acid-hardening resist, a post-development bake may be employed if desired at temperatures of from about 100° to 150° C. for several minutes to further cure the relief image formed upon development. After development and any post-development cure, the substrate surface bared by development may then be selectively processed, for example chemically etching or plating substrate areas bared of photoresist in accordance with procedures known in the art. Suitable etchants include a hydrofluoric acid etching solution and a plasma gas etch such as an oxygen plasma etch.

All the patents, patent applications and other documents mentioned herein are fully incorporated herein by reference.

The foregoing description of the present invention is merely illustrative thereof, and it is understood that variations and modification thereof can be made without departing from the spirit of scope of the invention as set forth in the following claims.

What is claimed is:

1. A method of forming a photoresist relief image comprising a pattern of lines, each line of the pattern having a width of less than about 0.35 microns and essentially vertical sidewalls, the method comprising:

(a) providing a photoresist composition comprising an admixture of a resin binder and a radiation sensitive component, said resin binder comprising a copolymer having phenolic and nonaromatic cyclic alcohol units where the copolymer has a weight average molecular weight of less than about 5,000 daltons, a weight average molecular weight to number average molecular weight ratio not exceeding 3, and a distribution of the cyclic alcohol concentration not exceeding about 8 mole percent, the radiation sensitive component being present in an amount capable of generating a latent image by exposure of a coating layer of said photoresist to activating radiation;

(b) applying a coating layer of the photoresist on a substrate and exposing the coating layer with patterned activating radiation; and (c) developing the imagewise exposed photoresist coating layer to provide said relief image.

2. The method of claim 1 where the distribution of the cyclic alcohol concentration is about 5 mole percent or less.

3. The method of claim 1 where the photoresist is an acid-hardening photoresist comprising an amine-based crosslinker and a photoacid generator.

4. The method of claim 1 where the photoresist is a positive-acting composition.

5. The method of claim 1 where the photoresist is a chemically amplified positive-acting composition.

* * * * *